United States Patent
Collins et al.

(10) Patent No.: US 10,837,121 B2
(45) Date of Patent: Nov. 17, 2020

(54) SUSCEPTOR SUPPORT

(71) Applicant: Applied Materials, Inc., Santa Clara, CA (US)

(72) Inventors: Richard O. Collins, Santa Clara, CA (US); Errol Antonio C. Sanchez, Tracy, CA (US); David K. Carlson, San Jose, CA (US); Mehmet Tugrul Samir, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 152 days.

(21) Appl. No.: 15/470,268

(22) Filed: Mar. 27, 2017

(65) Prior Publication Data

US 2017/0275777 A1    Sep. 28, 2017

Related U.S. Application Data

(60) Provisional application No. 62/337,906, filed on May 18, 2016, provisional application No. 62/314,044, filed on Mar. 28, 2016.

(51) Int. Cl.
| | |
|---|---|
| *C30B 25/12* | (2006.01) |
| *C23C 14/50* | (2006.01) |
| *C23C 16/48* | (2006.01) |
| *C23C 16/458* | (2006.01) |

(52) U.S. Cl.
CPC .............. *C30B 25/12* (2013.01); *C23C 14/50* (2013.01); *C23C 16/4583* (2013.01); *C23C 16/481* (2013.01)

(58) Field of Classification Search
USPC ........................................ 118/715, 728, 500
See application file for complete search history.

(56) References Cited

U.S. PATENT DOCUMENTS

| | | | | |
|---|---|---|---|---|
| 3,002,286 | A * | 10/1961 | Altenburg | .............. G01B 13/12 |
| | | | | 33/555 |
| 6,310,327 | B1 | 10/2001 | Moore et al. | |
| 6,893,507 | B2 * | 5/2005 | Goodman | ........... C23C 16/4581 |
| | | | | 118/725 |

(Continued)

FOREIGN PATENT DOCUMENTS

EP      0 471 365 A1    2/1992

OTHER PUBLICATIONS

PCT Notification of Transmittal of the International Search Report and the Written Opinion of the International Searching Authority for International Application No. PCT/US2017/019102; dated Jun. 7, 2017; 16 total pages.

*Primary Examiner* — Yewebdar T Tadesse
(74) *Attorney, Agent, or Firm* — Patterson + Sheridan, LLP

(57) ABSTRACT

Embodiments described herein generally relate to a susceptor support for supporting a susceptor in a deposition process. The susceptor support includes a shaft, a plate with a first major surface coupled to the shaft, and a support element extending from a second major surface of the plate. The plate may be made of a material that is optically transparent to the radiation energy from a plurality of energy sources disposed below the plate. The plate may have a thickness that is small enough to minimize radiation transmission loss and large enough to be thermally and mechanically stable to support the susceptor during processing. The thickness of the plate may range from about 2 mm to about 20 mm.

14 Claims, 8 Drawing Sheets

(56) References Cited

U.S. PATENT DOCUMENTS

| | | |
|---|---|---|
| 7,314,526 B1 | 1/2008 | Pretti et al. |
| 2004/0211365 A1 | 10/2004 | Yamaguchi |
| 2009/0096460 A1* | 4/2009 | Watanabe ............... G01L 21/32 |
| | | 324/462 |
| 2012/0309175 A1 | 12/2012 | Masumura |
| 2014/0290573 A1 | 10/2014 | Okabe et al. |
| 2014/0345526 A1* | 11/2014 | Ranish .............. H01L 21/02293 |
| | | 118/715 |

* cited by examiner

SUSCEPTOR SUPPORT

CROSS-REFERENCE TO RELATED APPLICATIONS

This application claims priority to U.S. Provisional Patent Application Ser. No. 62/314,044, filed on Mar. 28, 2016, and to U.S. Provisional Patent Application Ser. No. 62/337,906, filed on May 18, 2016, which herein are incorporated by reference.

BACKGROUND

Field

An apparatus for semiconductor processing is disclosed herein. More specifically, embodiments disclosed herein relate to a susceptor support for supporting a susceptor in a deposition process.

Description of the Related Art

In the fabrication of integrated circuits, deposition processes such as chemical vapor deposition (CVD) or epitaxy processes are used to deposit films of various materials upon semiconductor substrates. Epitaxy is a process that is used extensively in semiconductor processing to form very thin material layers on semiconductor substrates. These layers frequently define some of the smallest features of a semiconductor device, and they may have a high quality crystal structure if the electrical properties of crystalline materials are desired. A deposition precursor is normally provided to a process chamber in which a substrate is disposed, the substrate is heated to a temperature that favors growth of a material layer having specific properties.

Conventionally the substrate is disposed on a susceptor, and the susceptor is supported by three or more arms extending from a shaft. A plurality of energy sources, such as lamps, may be disposed below the substrate to heat a backside of the substrate. The susceptor is typically used to spread out any non-uniformities in the radiation from the energy sources. Radiation from the energy sources is obstructed by the susceptor support arms, causing non-uniformities that cannot be adequately removed by the susceptor, resulting in non-uniform heating of the substrate.

Therefore, an improved apparatus for supporting the susceptor is needed.

SUMMARY

Embodiments disclosed herein relate to a susceptor support for supporting a susceptor in a deposition process. In one embodiment, an apparatus includes a shaft, and a plate having a first major surface coupled to the shaft. The plate includes quartz, fused quartz, alumina, sapphire, or yttria, and the plate has a thickness ranging from about 2 mm to about 20 mm. The apparatus further includes a support element extending from a second major surface of the plate.

In another embodiment, an apparatus includes a shaft, and a plate having a first major surface coupled to the shaft. The plate includes quartz, fused quartz, alumina, sapphire, or yttria. The apparatus further includes a support element extending from a second major surface of the plate, and the support element has a height ranging from about 30 mm to about 60 mm.

In another embodiment, a process chamber includes a first enclosure member, a second enclosure member, and a susceptor support. At least a portion of the susceptor support is disposed between the first enclosure member and the second enclosure member. The susceptor support includes a shaft, and a plate having a first major surface coupled to the shaft. The plate includes quartz, fused quartz, alumina, sapphire, or yttria, and the plate has a thickness ranging from about 2 mm to about 20 mm. The apparatus further includes a support element extending from a second major surface of the plate. The process chamber further includes a plurality of energy sources disposed facing the second enclosure member.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Embodiments described herein generally relate to a susceptor support for supporting a susceptor in a deposition process. The susceptor support includes a shaft, a plate with a first major surface coupled to the shaft, and a support element extending from a second major surface of the plate. The plate may be made of a material that is optically transparent to the radiation energy from a plurality of energy sources disposed below the plate. The plate may have a thickness that is small enough to minimize radiation transmission loss and large enough to be thermally and mechanically stable to support the susceptor during processing. The thickness of the plate may range from about 2 mm to about 20 mm. The support element may be disposed on the plate or formed integrally with the plate, and may be provided at one or more locations on the plate outside of a substrate processing diameter, which is a diameter of the plate that is generally covered by a substrate disposed on the susceptor during processing.

Figure 1:
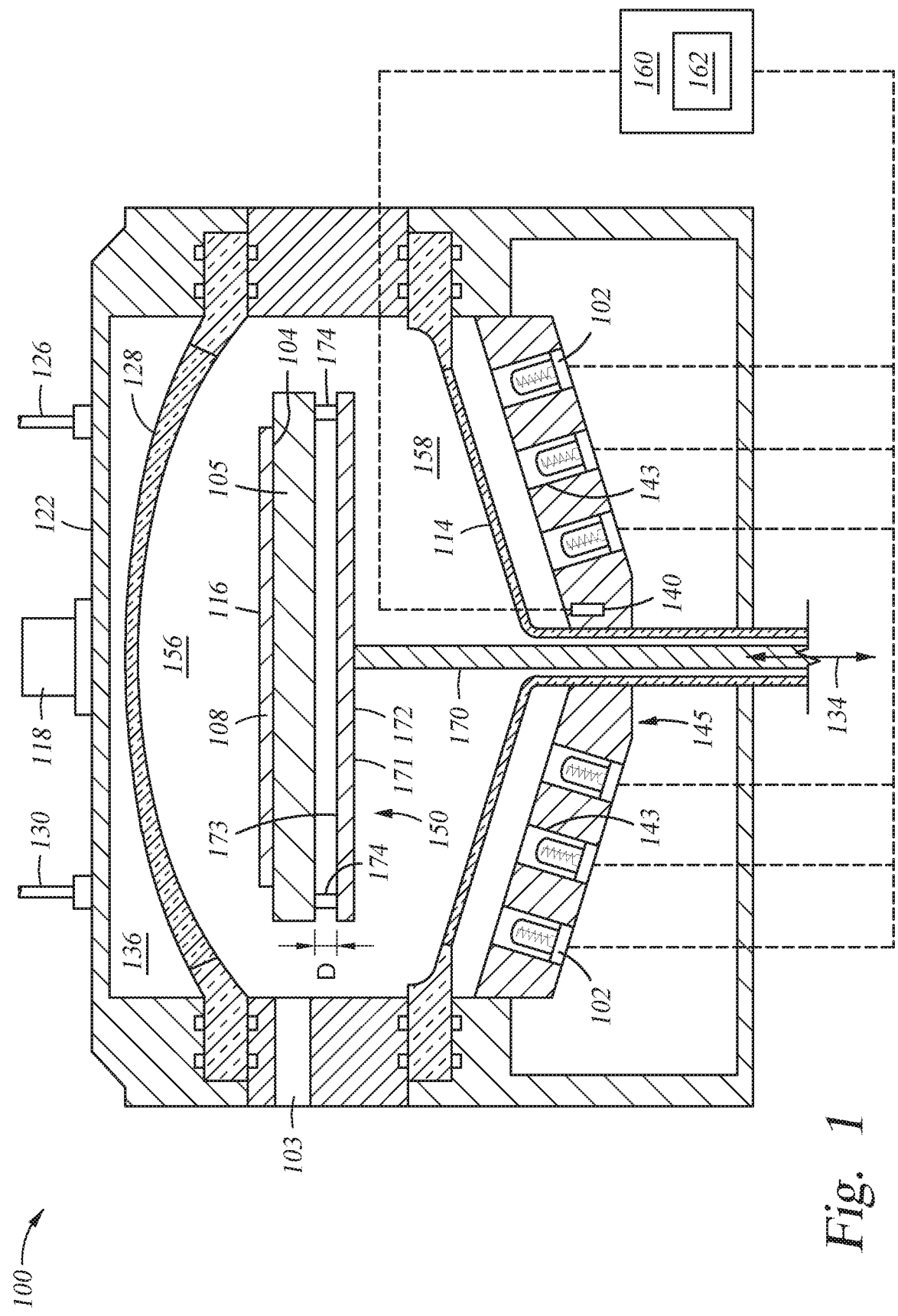
FIG. 1 is a schematic cross-sectional view of a process chamber according to one embodiment described herein.

FIG. 1 is a schematic cross-sectional view of a process chamber 100 according to one embodiment. The process chamber 100 may be used to process one or more substrates, including the deposition of a material on a deposition surface 116 of a substrate 108. The process chamber 100 includes a plurality of energy sources 102 for heating, among other components, a back side 104 of the substrate 108 disposed within the process chamber 100. The plurality of energy sources 102 may be a plurality of heating lamps. The substrate 108 may be supported by a susceptor 105, which is supported by a susceptor support 150. The susceptor 105 may be made of silicon carbide or graphite with a silicon carbide coating. The susceptor support 150 includes a shaft 170, a plate 172 coupled to the shaft 170, and a support element 174 extending from the plate 172. The shaft 170 is centrally coupled to a first major surface 171 of the plate, and the support element 174 extends from a second major surface 173 of the plate opposite the first major surface 171. The plate 172 may be a disk, and is made of a material that is optically transparent to the radiation energy from the plurality of energy sources 102 disposed below the plate 172. Optically transparent means that the material transmits most of the radiation energy and very little is reflected and/or absorbed. In one embodiment, the plate is made of quartz, such as fused quartz. In other embodiments, the plate 172 is made of alumina, sapphire, or yttria.

The plate 172 may have a thickness that is small enough to minimize radiation transmission loss and large enough to be thermally and mechanically stable to support the susceptor during processing. The thickness of the plate may range from about 2 mm to about 20 mm, such as from about 4 mm to about 8 mm. The support element 174 may be provided on the plate 172 at one or more locations outside of a substrate processing diameter of the plate 172, which is a diameter of the plate 172 that is generally covered by the substrate 108 disposed on the susceptor 105 during processing. In other words, the support element 174 is not located directly under the substrate 108. In one embodiment, the substrate 108 has a diameter of about 300 mm and the support element 174 is located on the plate 172 at a diameter greater than 300 mm, such as from about 310 mm to about 360 mm. The plate 172 may have a diameter similar or larger than the diameter of the susceptor 105. In one embodiment, the plate 172 has a diameter of about 370 mm. Compared to conventional susceptor supports, the plate 172 provides a uniform medium for the radiation energy to pass through. In addition, the support element 174 is not located directly under the substrate 108, thus the support element 174 does not obstruct the radiation energy from the plurality of energy sources 102 to the back side 104 of the substrate 108. A distance D between the susceptor 105 and the plate 172 may provide more uniform heating of the substrate 108. The distance D may range from about 10 mm to about 60 mm, such as from about 30 mm to about 60 mm, for example about 40 mm.

At least a portion of the susceptor support 150 is located within the process chamber 100 between a first enclosure member 128 and a second enclosure member 114. The substrate 108 can be brought into the process chamber 100 and positioned onto the susceptor 105 through a loading port 103. The susceptor 105 and the plate 172, while located in the processing position, divide the internal volume of the process chamber 100 into a process gas region 156 (between the substrate 108 and the first enclosure member 128) and a purge gas region 158 (between the plate 172 and the second enclosure member 114). The susceptor support 150 may be rotated about a central axis thereof during processing to minimize the effect of thermal and process gas flow spatial anomalies within the process chamber 100 and thus facilitate uniform processing of the substrate 108. The susceptor support 150 moves the susceptor 105 in an axial direction 134 during loading and unloading, and in some instances, during processing of the substrate 108.

In general, the first enclosure member 128 and the second enclosure member 114 are formed from an optically transparent material such as quartz. The first enclosure member 128 and the second enclosure member 114 are thin to minimize thermal memory, typically having a thickness between about 3 mm and about 10 mm, for example about 4 mm. The first enclosure member 128 may be thermally controlled by introducing a thermal control fluid, such as a cooling gas, through an inlet portal 126 into a thermal control space 136, and withdrawing the thermal control fluid through an exit portal 130. In some embodiments, a cooling fluid circulating through the thermal control space 136 may reduce deposition on an inner surface of the first enclosure member 128. The second enclosure member 114 may have a conical shape in order to withstand the vacuum condition inside the process chamber 100. In one embodiment, the second enclosure member 114 is made of quartz, which is optically transparent to the radiation energy from the plurality of energy sources 102.

A reflector 122 may be optionally placed outside the first enclosure member 128 to reflect radiation that is radiating from the substrate 108 back onto the substrate 108. Due to the reflected radiation, the efficiency of the heating will be improved by containing heat that could otherwise escape the process chamber 100. The reflector 122 can be made of a metal such as aluminum, brass, or stainless steel.

The plurality of energy sources 102 may be adapted to heat the substrate 108 to a temperature within a range of about 200 degrees Celsius to about 1,400 degrees Celsius, such as about 300 degrees Celsius to about 1,350 degrees Celsius. The plurality of energy sources 102 may be positioned within a compartmented housing 145. Each energy source 102 may be disposed inside a tube 143. A plurality of thermal radiation sensors 140, which may be pyrometers, may be disposed in the housing 145 for measuring thermal emissions of the substrate 108. The sensors 140 are typically disposed at different locations in the housing 145 to facilitate viewing different locations of the substrate 108 during processing. Sensing thermal radiation from different locations of the substrate 108 facilitates comparing the thermal energy content, for example the temperature, at different locations of the substrate 108 to determine whether temperature anomalies or non-uniformities are present. Such non-uniformities can result in non-uniformities in film formation, such as thickness and composition. At least two sensors 140 are typically used, but more than two may be used. Different embodiments may use three, four, five, six, seven, or more sensors 140.

A thermal sensor 118 may be disposed in the reflector 122 to monitor a thermal state of the first enclosure member 128, or to monitor the thermal state of the substrate 108 from a viewpoint opposite that of the sensors 140. Such monitoring may be useful to compare to data received from the sensors 140, for example to determine whether a fault exists in the data received from the sensors 140. The thermal sensor 118 may be an assembly of sensors in some cases, featuring more than one individual sensor. Thus, the process chamber 100 may feature one or more sensors disposed to receive radiation emitted from a first side of a substrate and one or more sensors disposed to receive radiation from a second side of the substrate opposite the first side.

A controller 160 receives data from the sensors 140 and separately adjusts power delivered to each energy source 102, or individual groups of energy sources 102, based on the data. The controller 160 may include a power supply 162 that independently powers the various energy sources 102. The controller 160 can be configured with a specific temperature profile, and based on comparing the data received from the sensors 140, the controller 160 adjusts power to energy sources 102 to conform the observed thermal data to the specific temperature profile.

Figure 2A:
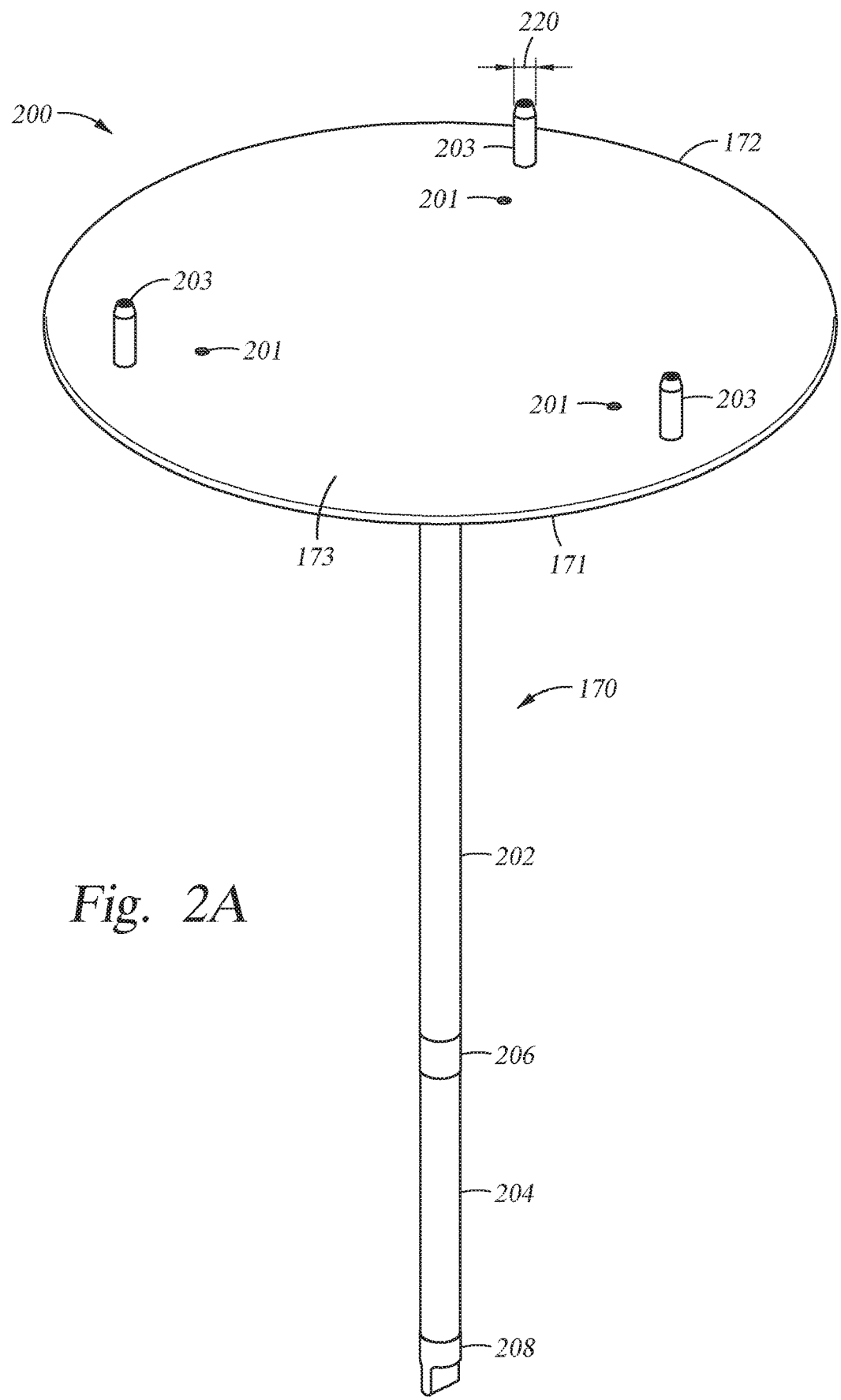
FIG. 2A is a perspective view of a susceptor support according to one embodiment described herein.

FIG. 2A is a perspective view of a susceptor support 200 according to one embodiment. The susceptor support 200 may be used in the process chamber 100 of FIG. 1 in place of the susceptor support 150. As shown in FIG. 2A, the susceptor support 200 includes the shaft 170, the plate 172 coupled to the shaft 170, and a plurality of support elements 203 extending from the plate 172. In one embodiment, the support elements 203 are a plurality of cylindrical posts, and the posts are located outside of the substrate processing diameter on the plate 172. A plurality of through holes 201 may be formed in the plate 172 for allowing a plurality of lift pins to pass through. Corresponding through holes may be formed in the susceptor 105 for allowing the plurality of lift pins to pass through.

The support elements 203 may be made of any suitable material, such as quartz, fused quarts, silicon carbide, silicon nitride, silicon carbide coated graphite, glassy carbon coated graphite, silicon nitride coated graphite, glassy carbon, graphite, silicon carbide coated quartz, or glassy carbon coated quartz. Each of the support elements 203 may have a height ranging from about 4 mm to about 60 mm, such as from about 30 mm to about 60 mm, and may have a diameter 220 ranging from about 5 mm to about 15 mm, such as about 10 mm. The susceptor 105 (FIG. 1) may be supported directly by the support elements 203 or may be supported by pins or caps disposed in or on the support elements 203. In one embodiment, the plate 172 is made of fused quartz, the support elements 203 are made of fused quartz, and the pins are made of solid silicon carbide.

The shaft 170 may include a first portion 202, a second portion 204, a spacer 206, and a connector 208. The first portion 202 and the second portion 204 may be made of fused quartz and the spacer 206 may be made of opaque quartz.

Figure 2B:
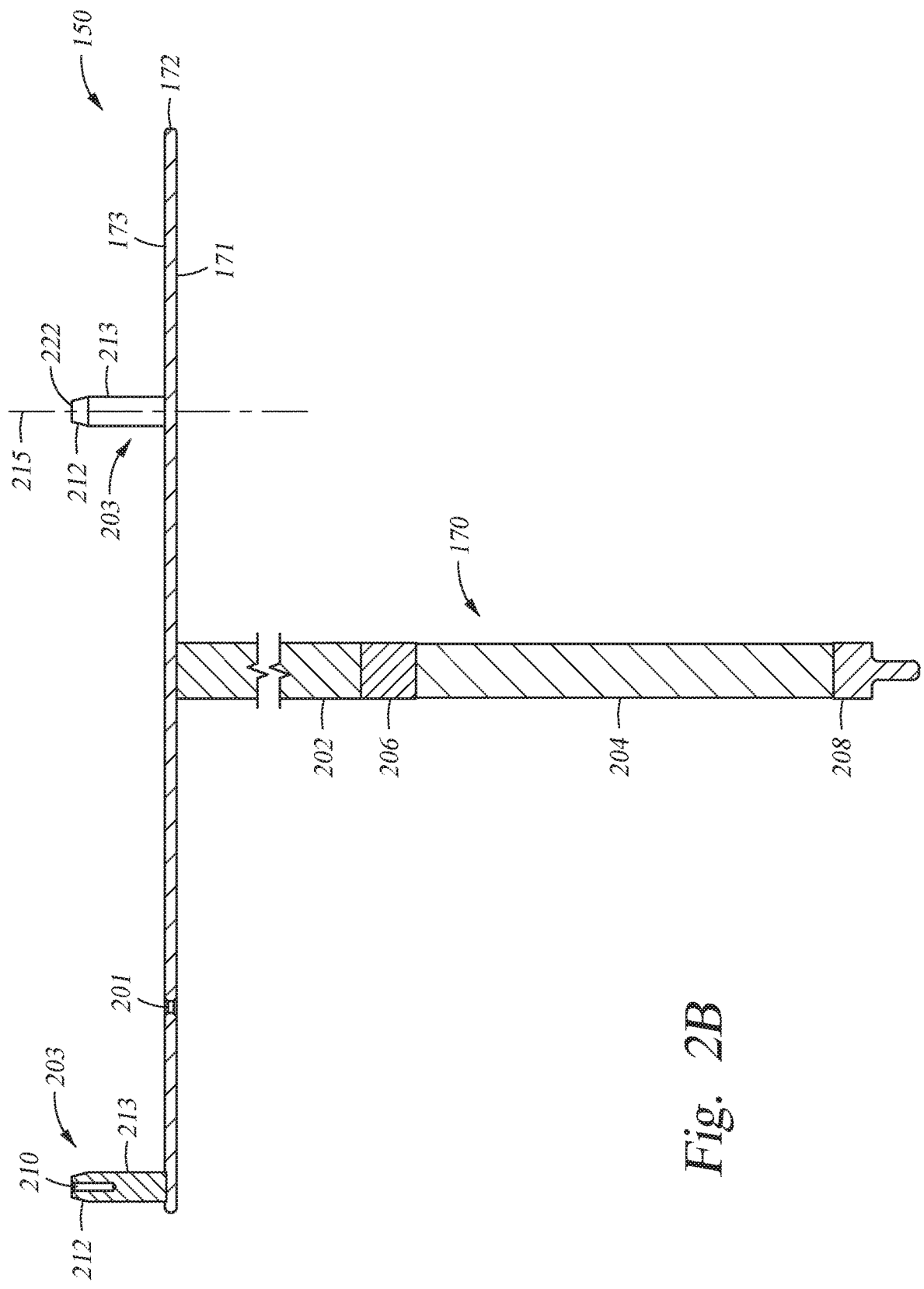
FIG. 2B is a schematic cross-sectional view of the susceptor support of FIG. 2A.

FIG. 2B is a schematic cross-sectional view of the susceptor support 200 of FIG. 2A. As shown in FIG. 2B, the support elements 203 may be fused to the plate 172. Each support element 203 may include an opening 210 for placing a pin therein, and the susceptor 105 may be supported by the pins disposed in the openings 210. Each support element 203 may include a wall 213 and a portion 212 having a tapered shape. The tapered portion 212 may be connected to the wall 213 and may have a flat top surface 222. The portion 212 may engage with a corresponding recess formed on a back side of the susceptor 105 for securing the susceptor 105. Other suitable methods may be used to secure the susceptor 105 to the support element 203.

Figure 2C:
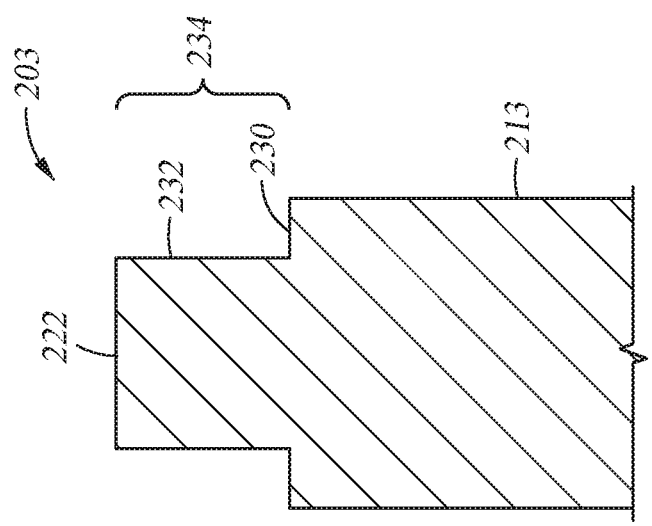
FIG. 2C is a schematic cross-sectional view of a support element according to one embodiment described herein.

The tapered shape of the portion 212 may have a linear taper, a sectioned taper, or a curved taper. For example, the tapered shape may be conical, and the tapered portion may form a constant angle with a wall 213 of the support element 203 that is between about 1° and about 30°, such as about 15°, toward a central axis 215 of the support element 203. As another example, as shown in FIG. 2C, the tapered shape may be a curved portion 224 that is substantially tangent to the wall 213 where the curved portion 224 meets the wall 213, and curves toward the central axis 215 of the support element 203. Thus, the curved portion 224 may be a rounded end of the support element 203, or the curved portion 224 may have a curved taper, as described above, with the flat top surface 222, as shown in FIG. 2C.

Figure 2D:
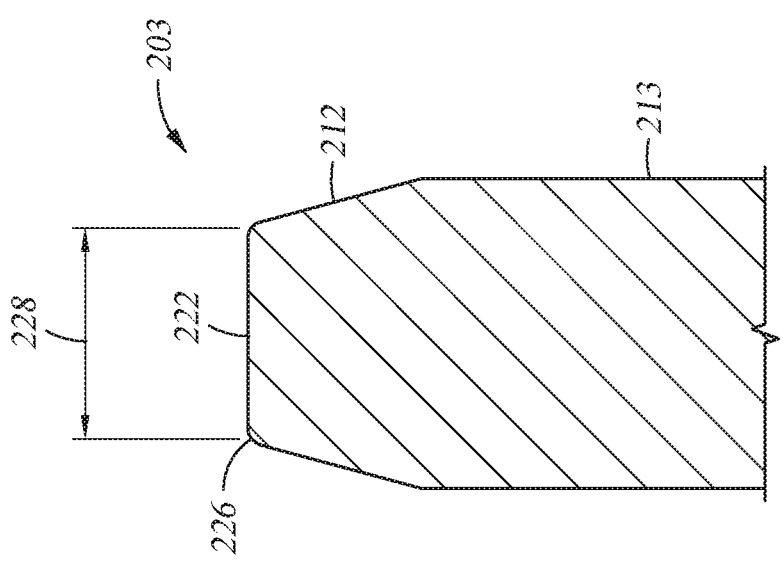
FIG. 2D is a schematic cross-sectional view of a support element according to one embodiment described herein.

A tapered portion may have a single radius of curvature, or multiple radii of curvature. In one embodiment, the portion 212 has a straight tapered shape that meets the flat top surface 222 at a curved joining portion 226, as shown in FIG. 2D. The flat top surface 222 may have a diameter 228 that is less than the diameter 220 of the support element 203, for example between about 30% and about 80% of the diameter 220 of the support element 203. The joining portion 226 may have a radius of curvature that is less than the diameter 228 of the flat top surface 222, for example between about 5% and about 20% of the diameter of the flat top surface 222. It should be noted that the curved joining portion 226, as described above may also be used to join the curved portion 224 (FIG. 2C) to the flat top surface 222. The curved joining portion 226 may also be used to join the portion 212, with curved or straight taper, with a curved top portion, meaning a top portion that is not flat.

Figure 2E:
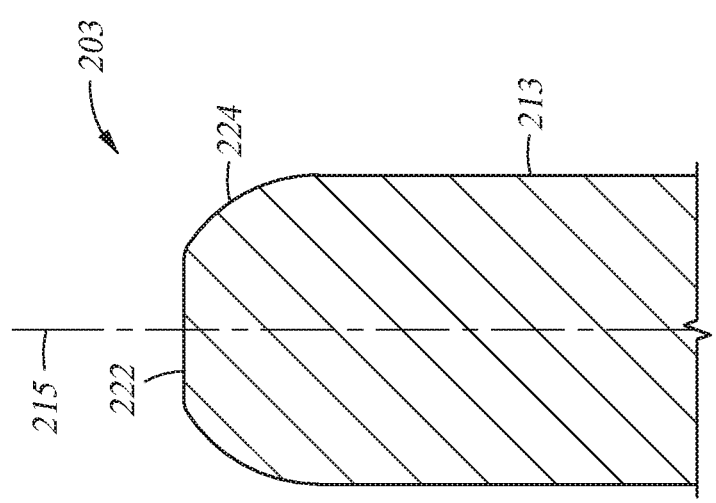
FIG. 2E is a schematic cross-sectional view of a support element according to one embodiment described herein.

Other tapered shapes may be used as well. For example, the tapered shape may include threading in some embodiments for attaching an end portion, such as a silicon carbide tip, to the support element 203. In one embodiment, the portion 212 may rise from a step 234 formed in the support element 203, as shown in FIG. 2E. The step 234 may have a lateral dimension 230 that is between 1% and 25%, for example about 5%, of the diameter 220 of the support element 203. The step 234 may include a portion 232 substantially perpendicular to the lateral dimension 230, and the portion 232 may be connected to the top surface 222. The lateral dimension 230 is shown substantially perpendicular to the wall 213 in FIG. 2E, although in other embodiments, the lateral dimension 230 may be non-perpendicular with the wall 213. In another embodiment, the entire support element 203 may be conical, or frustoconical, in shape from where the support element 203 joins the plate 172 to substantially near the end of the support element 203, with any desired end features for engaging with the susceptor 105. Finally, as noted above, the taper may be sectioned. In one example, the portion 212 may have a first portion with a frustoconical shape having a profile that forms a first angle with the wall 213, and a second portion with a frustoconical shape having a profile that forms a second angle with the first portion such that the portion 212 is tapered, with a linear profile, but forming an angle with the wall 213 that is not constant. For a sectioned taper, any number of sections may be used.

Figure 3A:
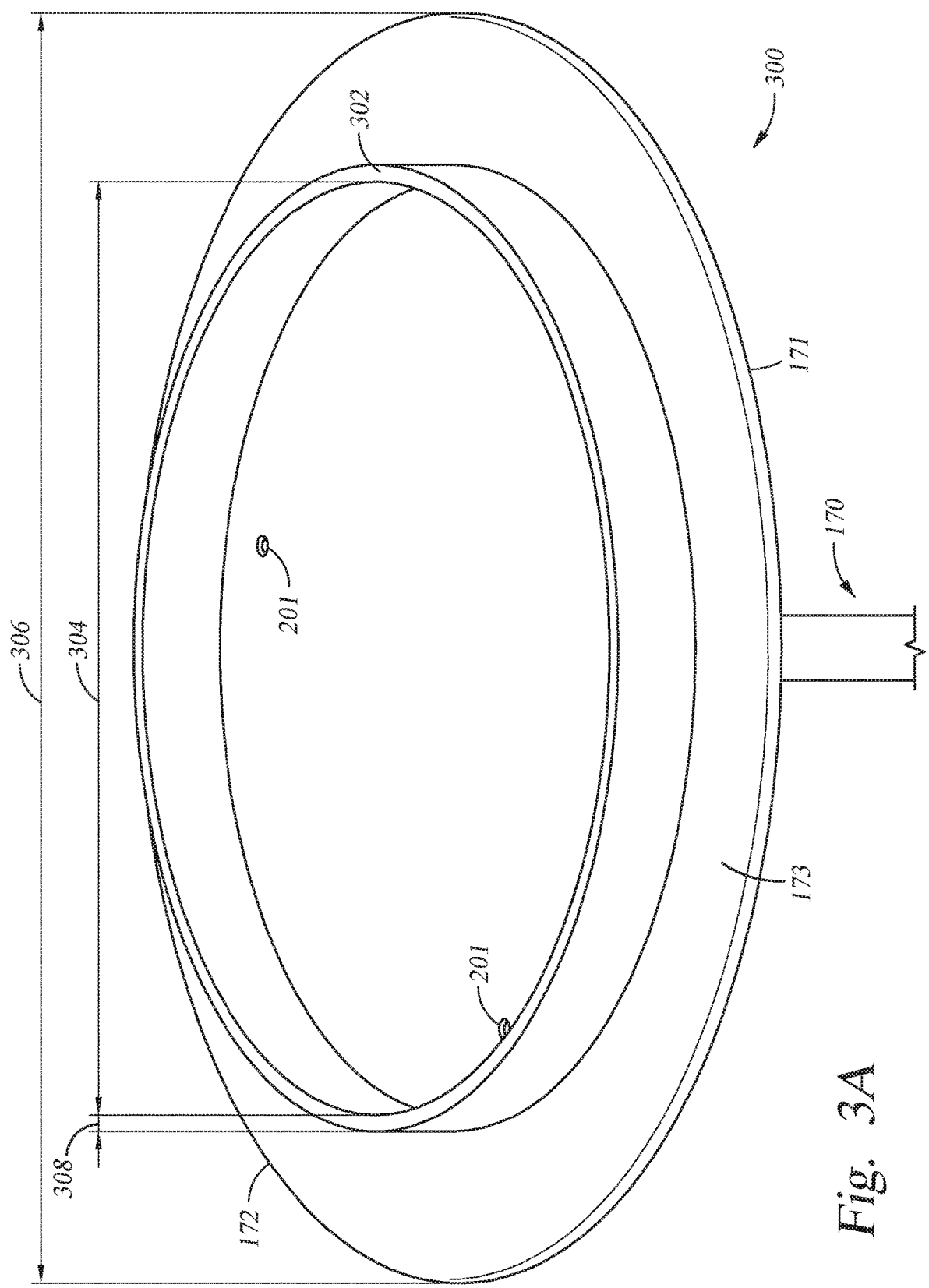
FIG. 3A is a perspective view of a susceptor support according to another embodiment described herein.

FIG. 3A is a perspective view of a susceptor support 300 according to another embodiment described herein. As shown in FIG. 3A, the susceptor support 300 includes the shaft 170, the plate 172 coupled to the shaft 170 at the first major surface 171, and a support element 302 extending from the second major surface 173 of the plate 172. The support element 302 may be a hollow cylinder, and may have an inner diameter 304 that is greater than the diameter of the substrate 108 (FIG. 1). In one embodiment, the substrate 108 has a diameter of about 300 mm and the support element 302 has an inner diameter 304 greater than 300 mm, such as from about 310 mm to about 360 mm. The plate 172 may have a diameter 306 similar or larger than the diameter of the susceptor 105. In one embodiment, the plate 172 has a diameter 306 of about 370 mm. The susceptor 105 may be supported by the support element 302. Alternatively, the substrate 108 may be directly supported by the support element 302. The support element 302 may be welded or fused to the plate 172, formed integrally with the plate 172, or placed in a groove formed in the plate 172 in order to secure the support element 302. The support element 302 may be made of any suitable material, such as quartz, fused quartz, silicon carbide, silicon nitride, silicon carbide coated graphite, glassy carbon coated graphite, silicon nitride coated graphite, glassy carbon, graphite, silicon carbide coated quartz, or glassy carbon coated quartz. The support element 302 may have a height ranging from about 30 mm to about 60 mm in order to have the distance D (FIG. 1) to be from about 30 mm to about 60 mm.

The support element 302 may have a thickness 308 that ranges from about 2 mm to about 50 mm. The thickness may be constant, or may vary with height, azimuth, or both. In one embodiment, a radial cross-section of the support element 302 has a rectangular shape, and in another embodiment, the radial cross-section of the support element 302 has a trapezoidal shape. The radial cross-section may be constant, or may vary with azimuth.

Figure 3B:
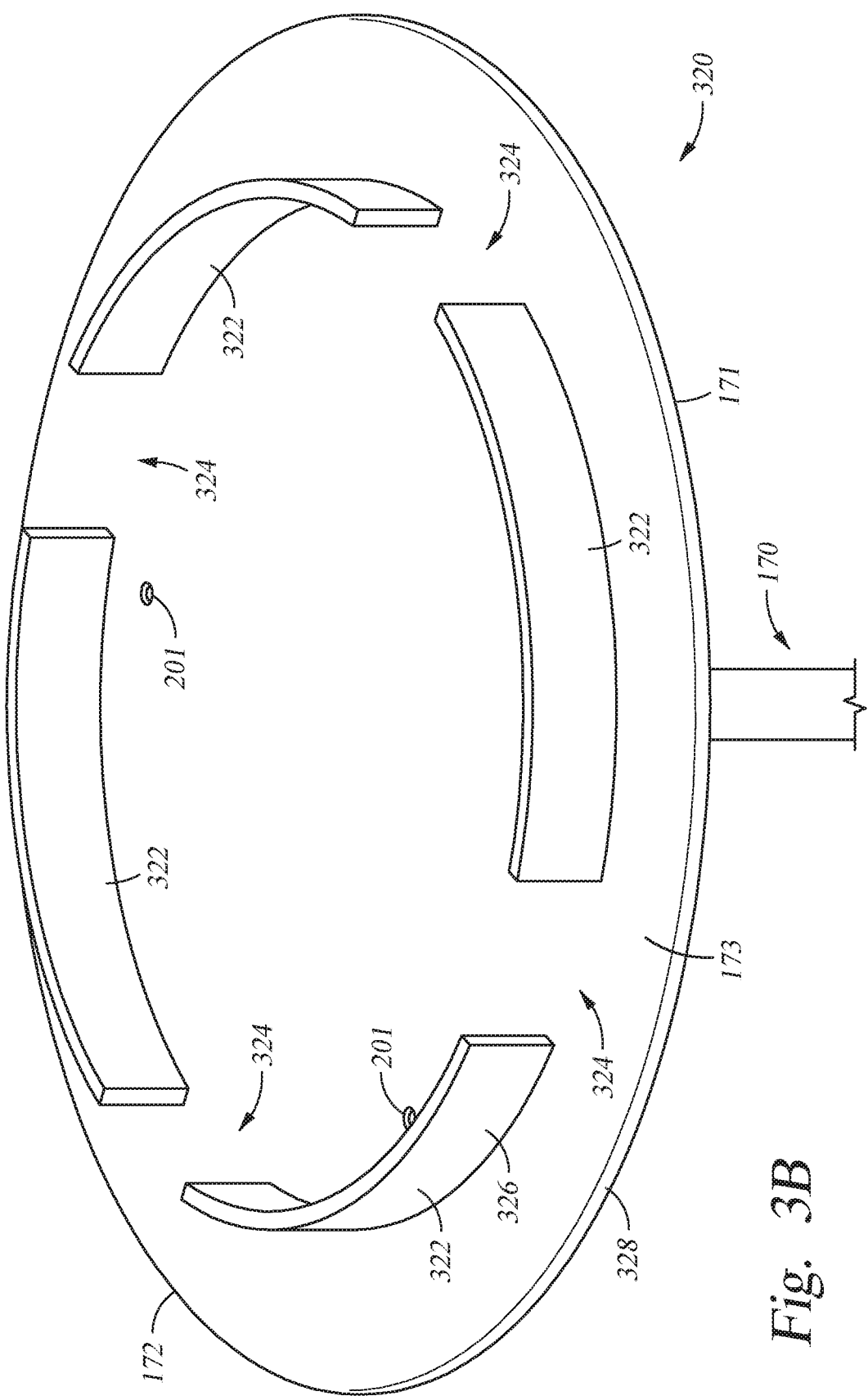
FIG. 3B is a perspective view of a susceptor support according to another embodiment described herein.

FIG. 3B is a perspective view of a susceptor support 320 according to another embodiment described herein. As shown in FIG. 3B, the susceptor support 320 includes the shaft 170, the plate 172 coupled to the shaft 170 at the first major surface 171, and a plurality of support elements 322 extending from the second major surface 173 of the plate 172. Each of the plurality of support elements 322 may have a curvature follows the curvature of the plate 172. In other words, each support element 322 may have an outer surface 326 that is substantially parallel to a thickness surface 328 of the plate 172. Lengths of the outer surfaces 326 of the plurality of support elements 322 may be the same or different. Adjacent support elements 322 may be separated by a space 324, and the spaces 324 may have the same dimension or different dimensions. The number of the support elements 322 may range from 2 to 10, such as from 3 to 6.

The support elements 322 may be made of any suitable material, such as quartz, fused quarts, silicon carbide, silicon nitride, silicon carbide coated graphite, glassy carbon coated graphite, silicon nitride coated graphite, glassy carbon, graphite, silicon carbide coated quartz, or glassy carbon coated quartz. Each of the support elements 322 may have a height ranging from about 30 mm to about 60 mm in order to have the distance D (FIG. 1) to be from about 30 mm to about 60 mm. The plurality of support elements 322 are located outside of the substrate processing diameter on the plate 172.

Figure 4A:
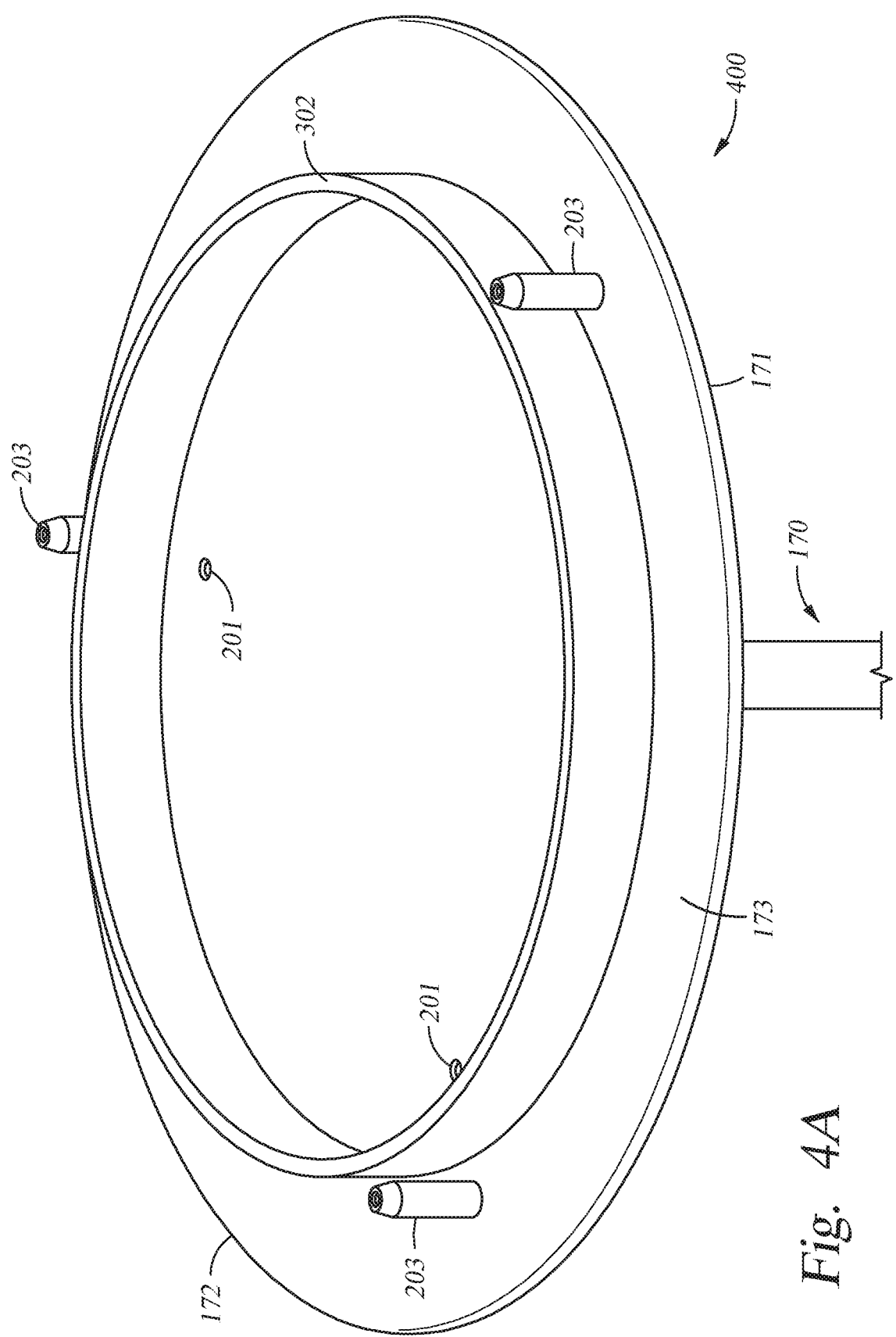
FIG. 4A is a perspective view of a susceptor support according to another embodiment described herein.

FIG. 4A is a perspective view of a susceptor support 400 according to another embodiment described herein. As shown in FIG. 4A, the susceptor support 400 includes the shaft 170, the plate 172 coupled to the shaft 170 at the first major surface 171, the plurality of support elements 203 extending from the second major surface 173, and the support element 302 extending from the second major surface 173. The susceptor 105 may be supported by the support elements 203, and the support element 302 is used shield the radiation energy coming from the support elements 203. As a result, the radiation energy the substrate 108 receives is from the radiation energy passing through a portion of the plate 172 that is surrounded by the support element 302. The support element 302 may have a diameter that is greater than the diameter of the substrate 108, and the support elements 203 are disposed outside of the support element 302 on the plate 172. The distance between each support element 203 and the support element 302 may range from about 1 mm to about 10 mm. The height of the support element 302 may be less than the height of each support element 203 when the susceptor 105 is directly supported by the support elements 203. The height of the support element 302 may be greater than the height of each support element 203 when the susceptor 105 is supported by pins disposed in the support elements 203.

Figure 4B:
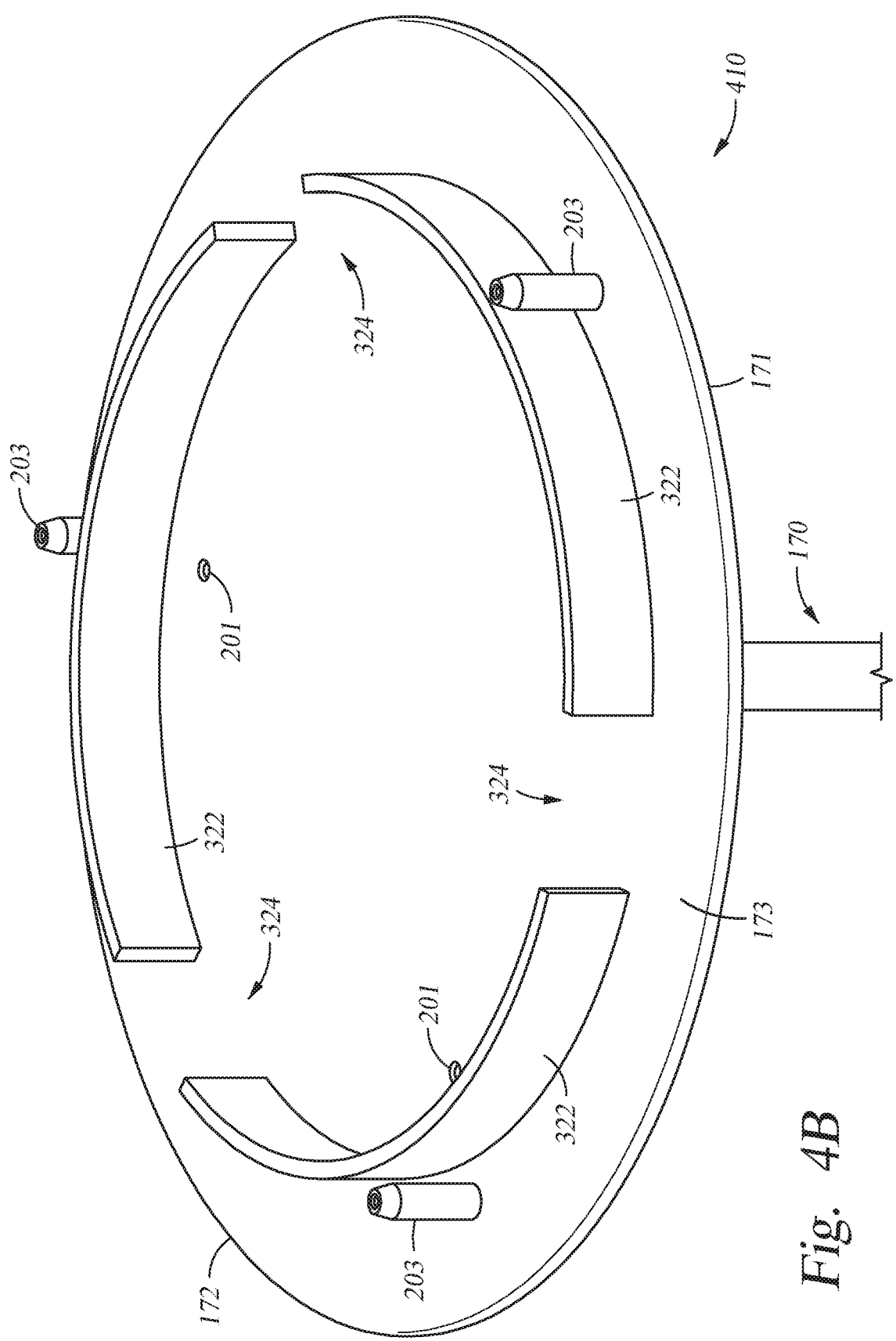
FIG. 4B is a perspective view of a susceptor support according to another embodiment described herein.

FIG. 4B is a perspective view of a susceptor support 410 according to another embodiment described herein. As shown in FIG. 4B, the susceptor support 410 includes the shaft 170, the plate 172 coupled to the shaft 170 at the first major surface 171, the plurality of support elements 203 extending from the second major surface 173, and the plurality of support elements 322 extending from the second major surface 173. The susceptor 105 may be supported by the support elements 203, and the support elements 322 are used shield the radiation energy coming from the support elements 203. As a result, the radiation energy the substrate 108 receives is from the radiation energy passing through a portion of the plate 172 that is surrounded by the support elements 322. The support elements 322 may be located adjacent to the support elements 203 in order to block the radiation energy from the support elements 203. In one embodiment, there are three support elements 203 and three support elements 322 located adjacent to the support elements 203. The distance between each support element 203 and a corresponding support element 322 may range from about 1 mm to about 10 mm. The height of each support element 322 may be less than the height of each support element 203 when the susceptor 105 is directly supported by the support elements 203. The height of each support element 322 may be greater than the height of each support element 203 when the susceptor 105 is supported by pins disposed in the support elements 203.

While the foregoing is directed to embodiments of the present disclosure, other and further embodiments of the disclosure may be devised without departing from the basic scope thereof, and the scope thereof is determined by the claims that follow.

The invention claimed is:

1. An apparatus, comprising:
a shaft;
a plate having a bottom surface in contact with the shaft, wherein the plate comprises quartz, fused quartz, alumina, sapphire, or yttria, and the plate has a thickness ranging from about 2 mm to about 20 mm; and
a support element extending from a top surface of the plate, wherein the support element comprises a plurality of cylindrical posts, and each cylindrical post of the plurality of cylindrical posts comprises a wall and a tapered portion connected to the wall.

2. The apparatus of claim 1, wherein the plate has a thickness ranging from about 4 mm to about 8 mm.

3. The apparatus of claim 1, wherein the tapered portion comprises a linear taper.

4. The apparatus of claim 1, wherein the tapered portion comprises a curved taper.

5. The apparatus of claim 1, further comprising a hollow cylinder extending from the top surface of the plate, wherein the plurality of cylindrical posts are disposed radially outward of the hollow cylinder.

6. The apparatus of claim 1, wherein the support element comprises quartz, fused quartz, silicon carbide, silicon nitride, silicon carbide coated graphite, glassy carbon coated graphite, silicon nitride coated graphite, glassy carbon, graphite, silicon carbide coated quartz, or glassy carbon coated quartz.

7. A process chamber, comprising:
a first enclosure member;
a second enclosure member;

a susceptor support, wherein at least a portion of the susceptor support is disposed between the first enclosure member and the second enclosure member, wherein the susceptor support comprises:
  a shaft;
  a plate having a bottom surface in contact with the shaft, wherein the plate comprises quartz, fused quartz, alumina, sapphire, or yttria, and the plate has a thickness ranging from about 2 mm to about 20 mm; and
  a support element extending from a top surface of the plate, wherein the support element comprises a plurality of cylindrical posts, and each cylindrical post of the plurality of cylindrical posts comprises a wall and a tapered portion connected to the wall; and
a plurality of energy sources disposed facing the second enclosure member.

8. The process chamber of claim 7, further comprising a susceptor disposed on the susceptor support, wherein a distance between the susceptor and the susceptor support ranges from about 10 mm to about 60 mm.

9. An apparatus, comprising:
a shaft;
a plate having a bottom surface in contact with the shaft, wherein the plate comprises quartz, fused quartz, alumina, sapphire, or yttria, and the plate has a thickness ranging from about 2 mm to about 20 mm; and
a support element extending from a top surface of the plate, wherein the support element comprises a hollow cylinder having an inside diameter and a thickness, and a sum of the inside diameter and the thickness is less than a diameter of the plate.

10. The apparatus of claim 9, wherein the support element comprises quartz, fused quartz, silicon carbide, silicon nitride, silicon carbide coated graphite, glassy carbon coated graphite, silicon nitride coated graphite, glassy carbon, graphite, silicon carbide coated quartz, or glassy carbon coated quartz.

11. The apparatus of claim 9, further comprising a plurality of cylindrical posts extending from the top surface of the plate.

12. The apparatus of claim 11, wherein the plurality of cylindrical posts is disposed radially outward of the hollow cylinder.

13. The apparatus of claim 11, wherein each of the plurality of cylindrical posts comprises a wall and a tapered portion connected to the wall.

14. The apparatus of claim 13, wherein the tapered portion comprises a linear taper.

* * * * *